(12) United States Patent
Chan et al.

(10) Patent No.: US 6,281,451 B1
(45) Date of Patent: Aug. 28, 2001

(54) ELECTRICAL CABLE DEVICE

(75) Inventors: Hong H. Chan, Hillsboro, OR (US);
Qinglun Chen, Tacoma, WA (US);
Emile Joseph Tayar, Pflugerville, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/160,028

(22) Filed: Sep. 24, 1998

(51) Int. Cl.[7] .............................. H01R 12/04; H05K 1/11
(52) U.S. Cl. ............................................ 174/262; 174/268
(58) Field of Search .................................. 174/261, 262, 174/263, 264, 265, 266, 268, 36; 361/792, 799, 749, 777

(56) References Cited

U.S. PATENT DOCUMENTS

| | | | |
|---|---|---|---|
| 3,932,932 | * 1/1976 | Goodman | 29/625 |
| 4,639,693 | * 1/1987 | Suzuki et al. | 333/1 |
| 5,844,783 | * 12/1998 | Kojima | 361/777 |
| 5,986,893 | * 11/1999 | Leigh et al. | 361/777 |
| 6,010,769 | * 1/2000 | Sasaoka et al. | 428/209 |

* cited by examiner

Primary Examiner—Jeffrey Gaffin
Assistant Examiner—Jeremy Norris
(74) Attorney, Agent, or Firm—Volel Emile; Edmond A. DeFrank

(57) ABSTRACT

An improved flexible cable construction is provided which includes two layers of conductor traces arranged alternately with three layers of dielectric material in a flattened configuration between ground plane outside metal surfaces. Each of the conductor layers includes alternating signal traces and ground traces. In an exemplary embodiment, vias are arranged in first and second planes through the cable. Longitudinal vias maintain the potential of ground planes at the same level as well as improving shielding effectiveness along an edge or thickness cross-section of the cable. Transverse vias are implemented to minimize antenna effects due to large openings at the point of cable entry into a sheet metal box containing high frequency electronics.

3 Claims, 4 Drawing Sheets

ELECTRICAL CABLE DEVICE

FIELD OF THE INVENTION

The present invention relates generally to electronics systems and more particularly to a connecting cable construction for use in connecting components of electronics systems.

BACKGROUND OF THE INVENTION

High performance electronics and computer systems employ state-of-the-art connecting cables to connect components, such as circuit boards, to each other. In computer systems for example, CPU (central processing unit) boards or motherboards are connected together and also to subsystem boards including I/O (input-output) boards and adapter boards. All of the interconnected boards contain ICs (integrated circuits) or ASICs (application specific integrated circuits) along with other components and generally perform one or more specific functions related to the operation of the system as a whole.

High wiring density, high wiring count, ease of termination to connectors, low noise and cross-talk and low cost are some of the main requirements to be met in the design of such connecting cables. Coaxial cables generally cannot meet density or cost requirements. So called "ribbon" cables cannot meet many performance requirements (noise, cross-talk) or density requirements. Standard flexible-circuit or flex cables are better suited for high density, low cost applications with low to medium performance requirements. Flex cables in some cases offer excellent performance but the performance degrades as wiring density is increased. Moreover, some flex cables often result in excessive and undesirable EMI (electromagnetic interference) problems.

Accordingly, there is a need for an enhanced connector cable construction which is effective to provide improved wiring density capacity with low noise and cross-talk characteristics and which is relatively inexpensive to manufacture and does not produce excessive EMI radiation.

SUMMARY OF THE INVENTION

A flexible quadplate cable construction is provided which includes at least four metal layers with at least three interposed dielectric layers. In an exemplary embodiment, the four metal layers include two outside layers enclosing the cable construction and two internal conductor layers. Each of the internal conductor layers includes alternating signal traces and ground traces. The internal conductor layers are arranged with signal traces of one internal conductor layer being opposite ground traces of the other internal conductor layer. In another example, transverse vias are positioned at points across the width of the cable to minimize antenna effects at enclosure entry points and longitudinal vias are positioned at the edges along the length of the cable to maintain the potential of ground planes at the same level and to improve shielding effectiveness.

BRIEF DESCRIPTION OF THE DRAWINGS

A better understanding of the present invention can be obtained when the following detailed description of a preferred embodiment is considered in conjunction with the following drawings, in which.

DETAILED DESCRIPTION

Figure 1:
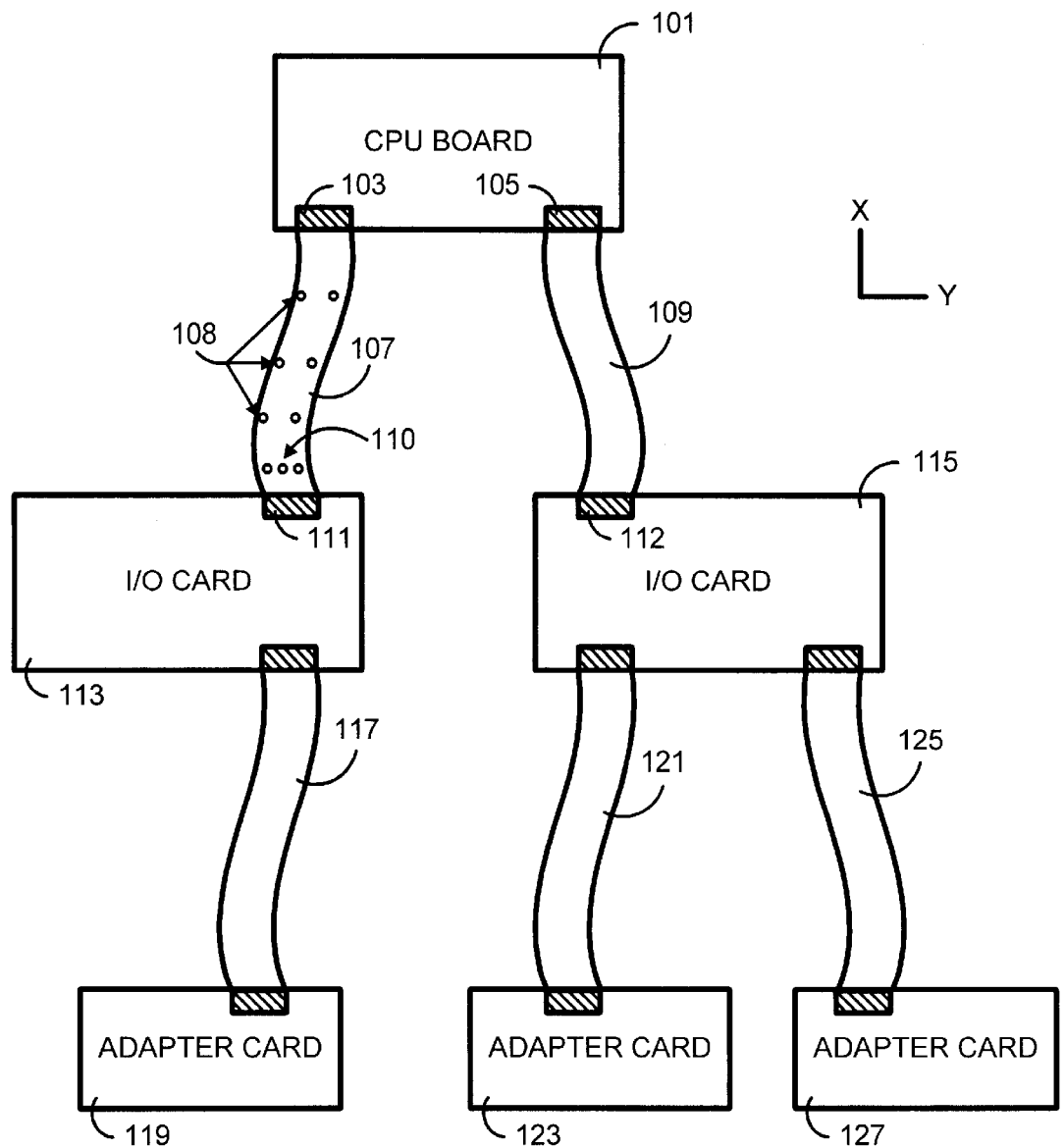
FIG. 1 is a schematic drawing illustrating a typical arrangement of circuit cards and interconnecting cables.

In the Figures, like numerals refer to like parts but all parts are not numbered in all of the drawings in order to more clearly present the features of the present invention and avoid unnecessary obfuscation of the drawings. In FIG. 1 there is shown an exemplary circuit board arrangement including a planar board or motherboard 101 having connector terminals 103 and 105 arranged to make electrical connections from the motherboard 101 to other circuit boards in the system. The connector terminals in the exemplary embodiment are standard MOLEX 2 mm pitch, four row connectors, although any of many similar connectors may be implemented. Generally, the connector terminals are designed to enable making connections between boards or devices. The connector terminals are soldered or otherwise connected to cable terminal vias which terminate signal and ground trace conductors within a flexible connector cable as hereinafter described. In the example, connectors 103 and 105 are shown coupled to corresponding connectors 111 and 112, respectively, on two I/O boards 113 and 115, respectively, by means of corresponding connector cables 107 and 109, respectively.

Connector cable 107 is shown to have longitudinal EMI vias 108 positioned at intervals along the length of the cable at the edges of the cable. The longitudinal vias 108 are positioned to maintain the potential of cable ground planes at the same level as well as to improve the shielding effectiveness along an edge or thickness cross-section of the cable. FIG. 1 also shows a series of transverse vias 110 which are disposed across the width of the cable 107 and repeated at certain intervals along the length of the cable. In the example only one row of transverse vias 110 is illustrated for the sake of simplicity although in an exemplary embodiment, a row of transverse vias was positioned across the cable at regular intervals along the length of the cable 107. The transverse vias are implemented to minimize antenna effects due to large openings at the point of cable entry into a sheet metal box containing high frequency electronics when the cables are used to connect two cards in different enclosures. The longitudinal vias 108 and transverse vias 110 are positioned on all of the connector cables in the Figures but are not shown in all of the Figures in order to simplify the Drawings.

Further in FIG. 1, I/O card 113 is connected by means of connector cable 117 to adapter card 119 and I/O card 115 is connected to two different adapter cards 123 and 127 by means of two other connector cables 121 and 125, respectively. The cards which are interconnected in the example may be any function or subsystem card and are not limited to adapter and/or I/O cards. As illustrated, the "X" axis is the axis along the length of the connector cable and the "Y" axis is the axis across the width of the connector cables. The depth of the connector cables between the flat outside surfaces of the cable is designated in the illustrations as the "Z" axis.

Figure 2:
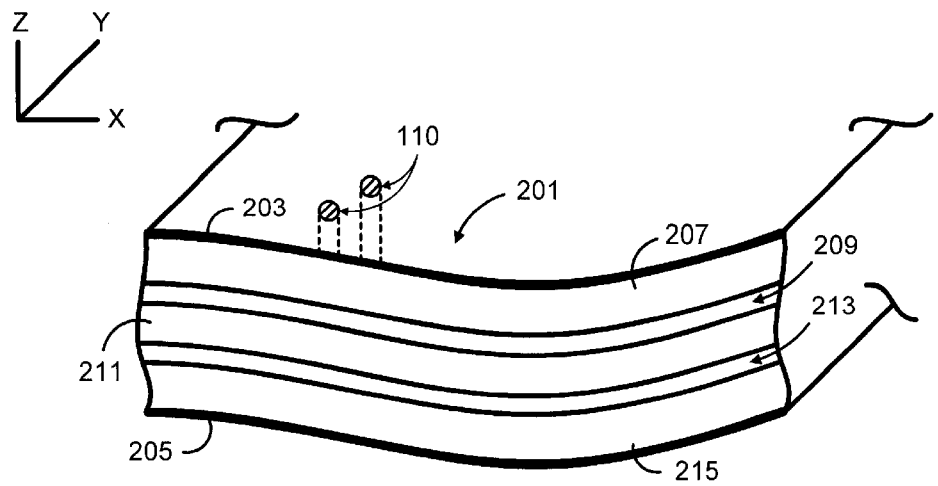
FIG. 2 is a partial perspective view of a cross-section of a flexible cable in accordance with the present invention.

In FIG. 2, a simplified partial cross-sectional view of a connector cable 201 assembled in accordance with the present invention is illustrated. The cable 201 includes four metal or conductive layers 203, 209, 213 and 205. Conductive layers 203 and 205 form outside surfaces of the cable 201 and are made of metallic mesh construction in the present example. The outside metal layers 203 and 205 function as conductive EMI shields. Two of the transverse vias 110 are also illustrated. On the inside of the outer metallic layers 203 and 205 are two non-conducting dielectric layers 207 and 215, respectively. Two internal conductive layers or trace layers 209 and 213 are positioned inside of the dielectric layers 207 and 215, respectively, and a central non-conductive dielectric layer 211 separates the internal conductive layers 209 and 213. The internal conductive layers 209 and 213 each contain a series of conductive traces disposed across the width of the cable 201 as illustrated in FIG. 3.

Figure 3:
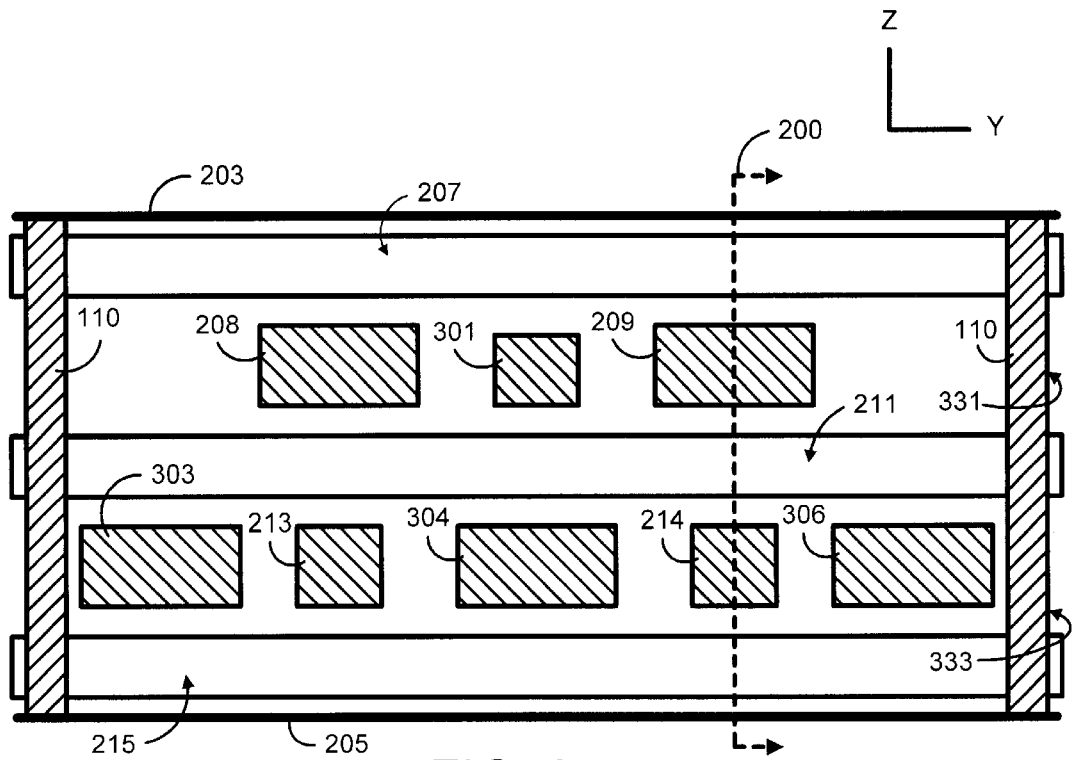
FIG. 3 is another cross-sectional view of a flexible cable construction in accordance with the present invention.

FIG. 3 illustrates an exploded view of a cross-section of the connector cable 201 shown in FIG. 2. Also shown is the line 200 along which the cross-section portion of FIG. 2 was taken. As illustrated, the cable construction includes outer conductive layers 203 and 205, which are electrically connected to the ends of two transverse vias 110. A first inner conductive layer 331 is comprised of a plurality of conductive traces including ground traces 208 and 209, and interposed signal traces such as signal trace 301. Similarly, a second inner conductive layer 333 is comprised of a series of ground traces such as ground traces 303, 304 and 306 and an interposed series of signal traces including signal traces 213 and 214. The inner conductive layers 331 and 333 are arranged such that each signal trace is surrounded by ground traces or a ground plane. For example, signal trace 214 is surrounded by ground traces 209 in the first conductive layer 331, ground traces 304 and 306 in the second conductive layer 333, and the second outer conductive layer 205. As illustrated, each conductive layer is also arranged with alternating ground traces and signal traces. This technique of surrounding signal traces with ground conductors provides a degree of isolation for signal traces from each other, reduces crosstalk between signal traces and reduces EMI radiation from the cable. In an exemplary embodiment, the ground and signal traces are separated by a distance of approximately 5–6 mils. The signal and ground traces are vertically displaced from each other or opposite each other in successive trace layers of the cable. In the example, the signal traces are 4 mils wide and 0.6 mils thick and the ground traces are 8–10 mils wide and 0.6 mils thick. The thickness of the non-conductive or dielectric layers is approximately 4–6 mils, and the total thickness of the cable itself is approximately 16–18 mils. Also in the exemplary embodiment, a spacing of approximately one inch is suggested between successive longitudinal edge vias 108 along the length of the cable although other spacing distances are also effective. Further, a spacing of approximately 0.5 inch is implemented between individual transverse vias 110 across the width of the cable. That spacing allowed approximately 25 conductive traces between transverse vias across the cable. The ground traces in the example are also arranged such that the transverse vias 110 are positioned only adjacent to ground traces such as 209 and 306, and are not positioned adjacent to signal traces. This arrangement will further enhance signal integrity. The measurements used in the example are only approximate and the exact dimensions may vary depending upon the system electrical requirements of each application.

Figure 4:
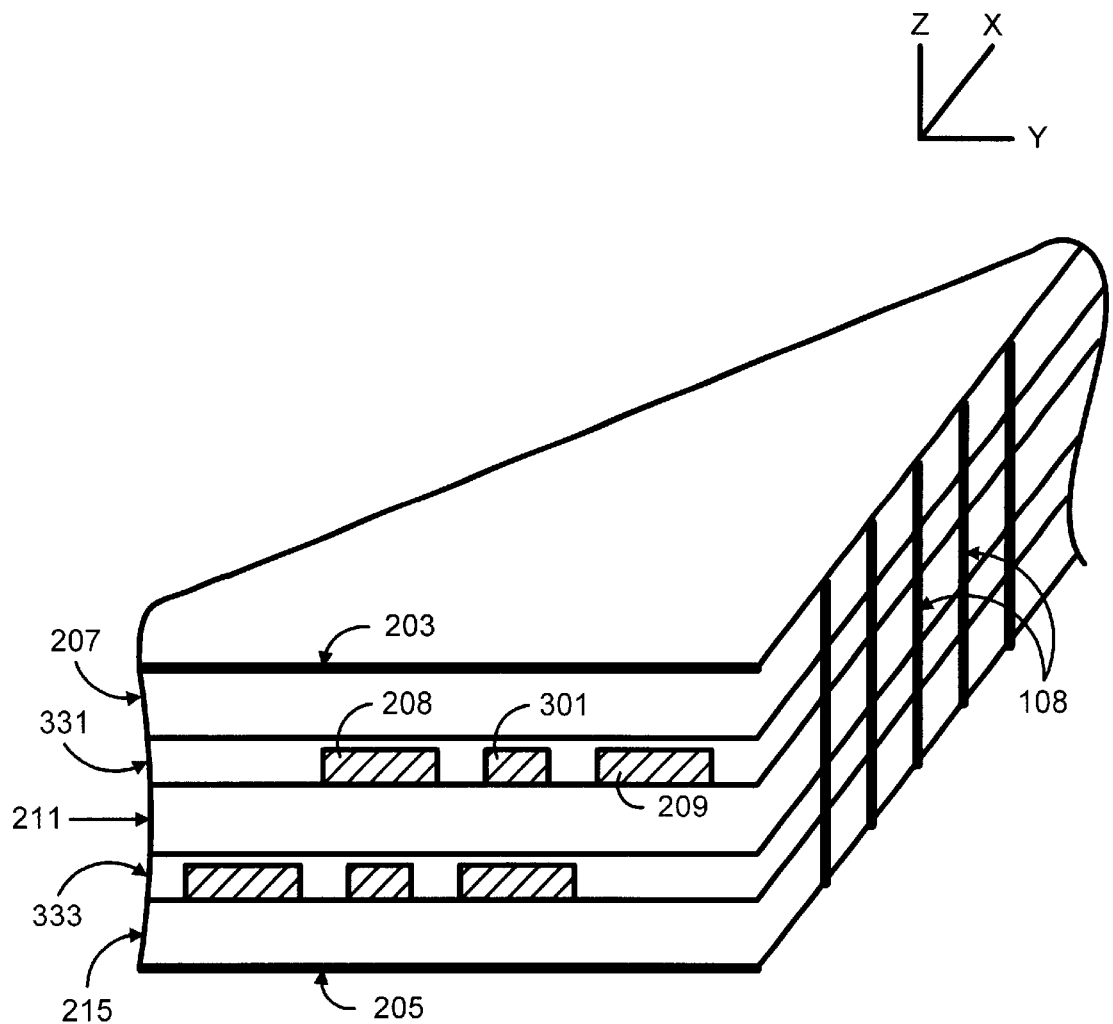
FIG. 4 is a partial cross-sectional perspective illustration of a cable construction in accordance with an exemplary embodiment of the present invention.

FIG. 4 is a partial cross-sectional perspective illustration of a cable construction in accordance with an exemplary embodiment of the present invention. First and second outer conductive layers 203 and 205, respectively, are electrically connected through the longitudinal vias 108. Transverse vias are not illustrated in FIG. 4 for the sake of simplicity. Within the first and second conductive layers 203 and 205 there are first and second non-conductive dielectric layers 207 and 215, respectively. Next inside of the first and second dielectric layers 207 and 215 are first and second inner conductive trace layers 331 and 333. Each of the trace layers is comprised of alternating signal traces such as trace 301 and ground traces such as trace 209. A central non-conductive dielectric layer 211 is positioned between the first and second inner conductive layers 331 and 333.

It is noted that in the exemplary embodiment, the distance between two trace layers (e.g. the distance between layers 331 and 333) can be less than the distance between the ground traces and the signal traces in the same conductor layer (e.g. the distance between centers of traces 208 and 301 in FIG. 3). This will minimize space between a signal trace (such as 301) and a ground trace (such as 304) which, in turn, results in improved signal quality as well as thinner and more flexible cable. Mesh ground planes can be used for the outer conductive layers 203 and 205 in this cable to reduce its effect on impedance and increase the cable's flexibility as long as the mesh's size is small enough to shield spurious electromagnetic radiation. Because of the low cross-talk characteristic of the exemplary cable construction, the signal line pitch of the cable can be reduced as long as the cables meet the electrical performance requirements such as impedance, attenuation, etc. The shielding ground planes also assist in lowering the series resistance of the ground traces for signal returning paths. The disclosed example uses four conductive layers and three interposed non-conductive layers but the present invention may also include a greater number "n" of the conductive layers and a corresponding number "n-1" of non-conductive layers arranged alternately as illustrated to practice the invention and attain the stated benefits.

Figure 5:
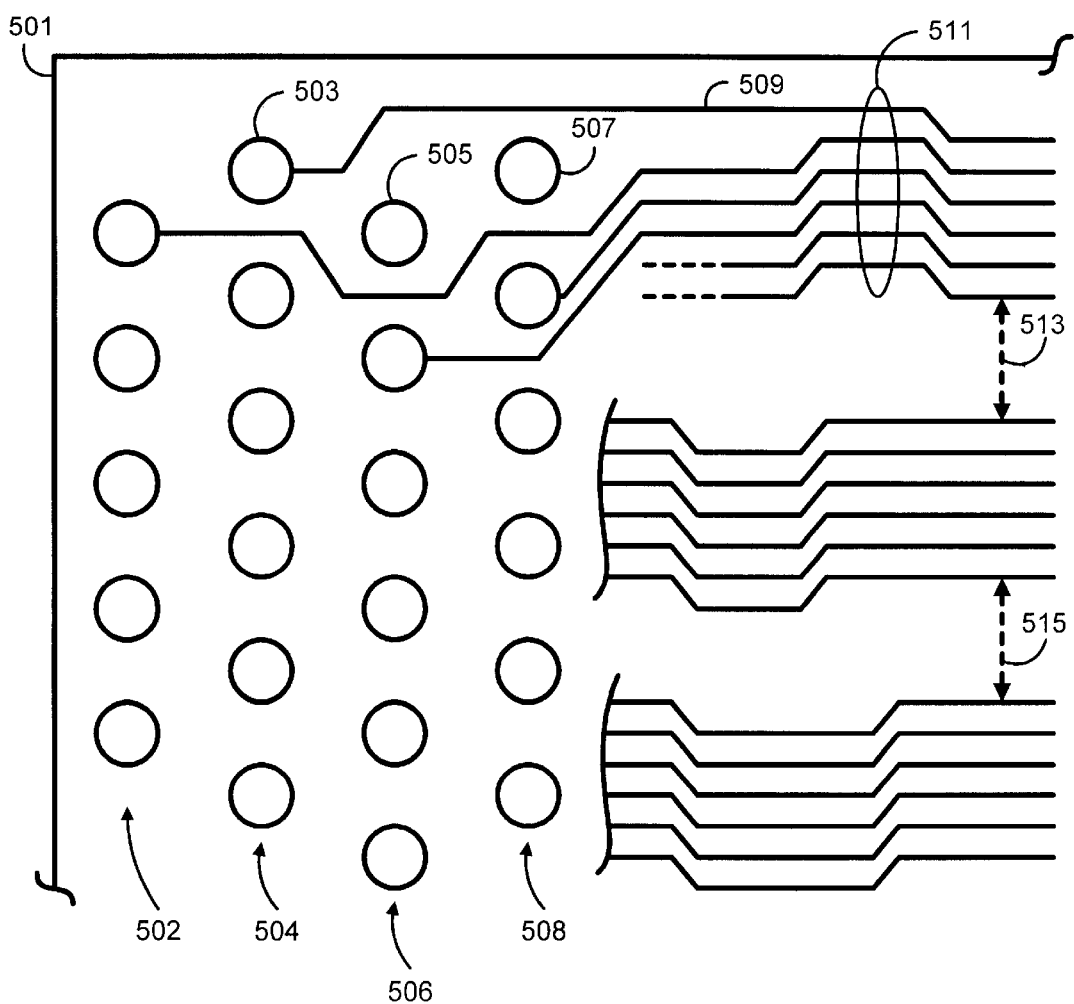
FIG. 5 is an illustration showing an exemplary end termination for the cable construction shown.

In FIG. 5, an exemplary termination for the traces in the cable is illustrated although not all of the connections are depicted or numbered in order to preserve clarity and avoid unnecessary obfuscation of the drawings. As shown, a trace or conductor layer 501 (such as trace layers 331 and 333) contains conductive traces, such as 509, as hereinbefore explained. The traces are arranged in groups 511 of six traces per group in the present example. The groups may contain more or less than six traces each depending upon particular applications. The groups 511 of traces are separated by predetermined distances 513 and 515 within the trace layer 501. Each trace is terminated at a point of connection such as, in the present example, vias 503, 505 and 507. By grouping the traces and separating the groups, space is created to allow all of the traces to be terminated at a connection via such as vias 503, 505 and 507. Vias 505 and 507 which appear to be unconnected in the drawing, are in fact arranged to be connected from below to traces in the second trace layer (not shown) of the cable 201. The terminal connector vias are arranged in four rows 502, 504, 506 and 508, to which standard cable end connectors may be attached.

The disclosed high-density (compared to COAX or ribbon cable) cable construction lends itself to termination into a variety of high I/O count, high density connectors such as the above referenced MOLEX 2 mm pitch, four row connector. The cable can also be terminated into "pin-in-hole" (PIH) connectors, surface mount connectors, or pressure (pad-on-pad) connectors. The trace routings at each end of the cable, and the type of termination, i.e. termination holes (vias) or termination pads, can be adapted to any one of many available connectors being used. The signal traces, as well as the ground and shield traces, terminate into corresponding terminal points of the connector.

The present invention has been described in connection with a preferred embodiment as disclosed herein. Although an embodiment of the present invention has been shown and described in detail herein, along with certain variants thereof, many other varied embodiments that incorporate the teachings of the invention may be easily constructed by those skilled in the art. Accordingly, the present invention is not intended to be limited to the specific form set forth herein, but on the contrary, it is intended to cover such alternatives, modifications, and equivalents, as can be reasonably included within the spirit and scope of the invention.

What is claimed is:

1. A cable device comprising:

first and second inner conductive layers with alternately positioned signal traces and ground traces;

first and second outer conductive layers forming outside surfaces of the cable device that surround said first and second inner conductive layers; and a plurality of longitudinal vias a positioned at predetermined intervals along outer edges of said cable device electrically connecting said first and second outer conductive layers of said cable device.

2. The cable device as set forth in claim 1 and further including a plurality of rows of transverse vias positioned in rows across said cable device, said rows being positioned at predetermined intervals along a length dimension of said cable device.

3. The cable device as set forth in claim 2 wherein said transverse vias are electrically connected to said first and second outer conductive layers.

* * * * *